United States Patent [19]
Marsh et al.

[11] Patent Number: 6,018,272
[45] Date of Patent: Jan. 25, 2000

[54] LINEARIZATION OF RESISTANCE

[75] Inventors: Douglas G. Marsh, Bethlehem; Frode Larsen, Allentown, both of Pa.

[73] Assignee: Lucent Technologies Inc., Murray Hill, N.J.

[21] Appl. No.: 08/778,123

[22] Filed: Jan. 2, 1997

[51] Int. Cl.⁷ ............................................. H01L 29/8605
[52] U.S. Cl. .......................................... 330/307; 257/538
[58] Field of Search .................................... 257/537, 538; 330/69, 75, 307

[56] References Cited

U.S. PATENT DOCUMENTS

| | | | |
|---|---|---|---|
| 3,196,668 | 7/1965 | McClellan | 338/2 X |
| 3,612,535 | 10/1971 | Davis et al. | 338/22 R X |
| 4,786,877 | 11/1988 | Leydier | 330/277 X |
| 5,428,242 | 6/1995 | Furuya et al. | 257/538 |
| 5,589,702 | 12/1996 | Alter | 257/537 X |
| 5,614,864 | 3/1997 | Stubbe et al. | 330/69 |
| 5,699,012 | 12/1997 | Hakkarainen | 330/69 X |

*Primary Examiner*—Steven J. Mottola

[57] ABSTRACT

A linearized resistor for integrated circuits combines an N-type diffused resistor and a P-type diffused resistor. In one embodiment, the N-type and P-type diffused resistors are connected in series. In another embodiment, the N-type and P-type diffused resistors are connected in parallel. Two or more linearized resistors of the present invention may be used in IC circuits, such as voltage dividers, inverting amplifiers, single-ended operational amplifiers, and single-ended differential operational amplifiers. Linearized resistors of the present invention can be designed to have voltage coefficients smaller than conventional IC resistors having a single diffused resistor. As such, linearized resistors of the present invention can be designed to provide more uniform resistance over their operating voltage range than conventional IC resistors. As a result, linearized resistors of the present invention can be used in differential circuits that are more effective in reducing odd and even harmonics than are conventional differential circuits.

25 Claims, 3 Drawing Sheets

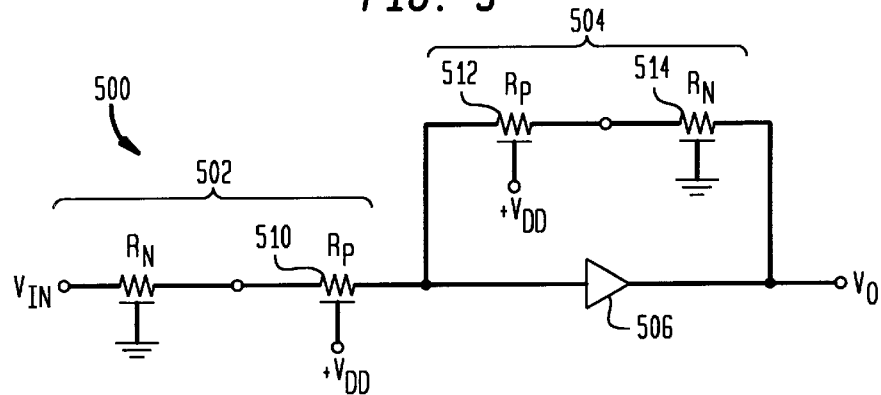
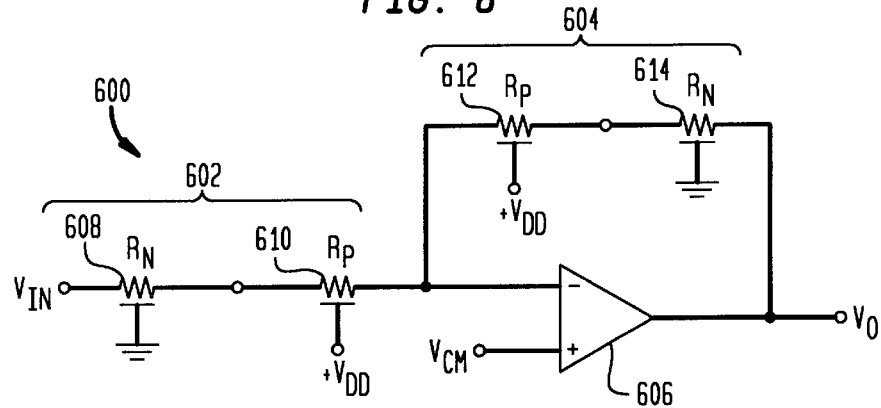
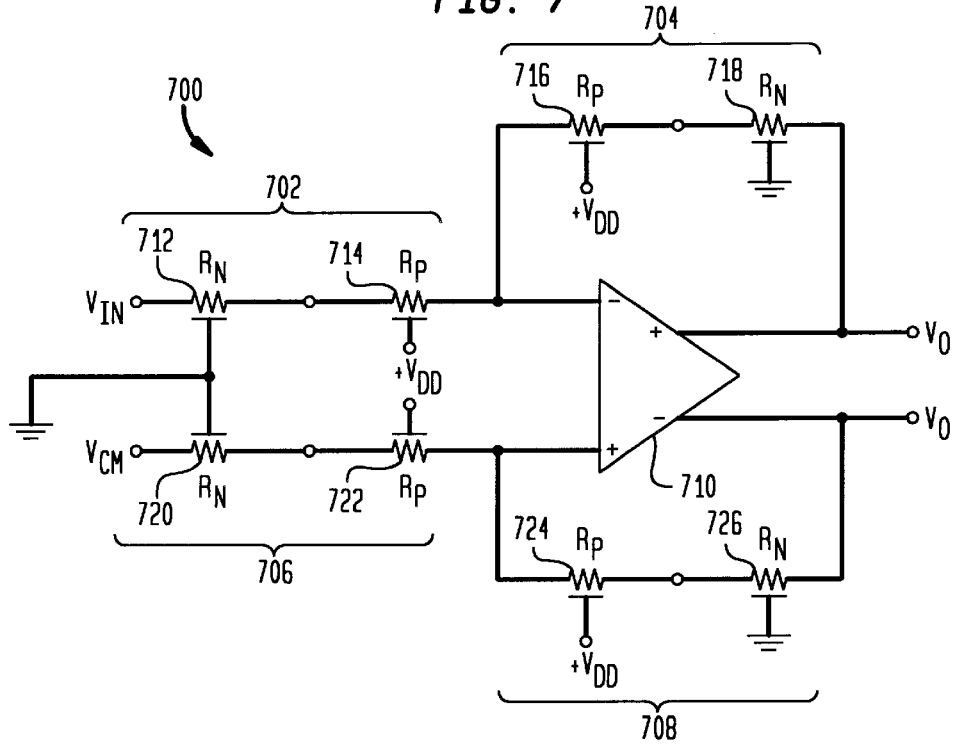

LINEARIZATION OF RESISTANCE

BACKGROUND OF THE INVENTION

1. Field of the Invention

The present invention relates to integrated circuits (ICs), and, in particular, to resistors for integrated circuits.

2. Description of the Related Art

Many integrated circuits designed to process analog signals use differential structures such as operational amplifiers (op-amps) which generate output signals that are proportional to the difference between two input signals. One advantage of differential structures is that they have the potential ability to cancel out even harmonics in the input signals.

In some configurations, a single input signal is converted into two input signals for a differential circuit. For example, the single input signal may be used as one input signal to the differential circuit, while an inverted version of that input signal is generated for use as the other input signal to the differential circuit. One conventional way to generate this second input signal is to use a unity-gain inverting amplifier to generate the negative of the original input signal.

Referring now to FIG. 1, there is shown a circuit diagram of conventional inverting amplifier 100 comprising operational amplifier 102, feedback resistor $R_F$ 104, and source resistor $R_S$ 106. In some IC implementations, resistors 104 and 106 are diffused resistors. Because diffused resistors have non-zero voltage coefficients, the resistance values of resistors 104 and 106 will vary with the voltage level between the resistor and the underlying material. As a result, the gain of inverting amplifier 100 will tend to deviate from the desired gain over the operating voltage range of the circuit. This means that the inverted signal $V_O$ (i.e., the second input signal to the differential circuit described earlier) will not always have the same magnitude as the original signal $V_{IN}$ (i.e., the first input signal to the differential circuit). In general, both odd and even harmonics are introduced.

One possible solution to this problem is to use polysilicon resistors, which have relatively small voltage coefficients, instead of diffused resistors. Unfortunately, polysilicon resistors tend to have low sheet resistance and may therefore require relatively large areas to implement.

One aspect of the present invention is to provide resistors having relatively small voltage coefficients for use in integrated circuits. Another aspect is the advantage of generating smaller odd and even harmonics than conventional IC resistor circuits.

Further aspects and advantages of this invention will become apparent from the detailed description which follows.

SUMMARY OF THE INVENTION

Embodiments of the present invention are directed to an integrated circuit having a linearized resistor comprising an N-type diffused resistor in combination with a P-type diffused resistor.

BRIEF DESCRIPTION OF THE DRAWINGS

Other aspects, features, and advantages of the present invention will become more fully apparent from the following detailed description, the appended claims, and the accompanying drawings in which:

FIG. 5 is a circuit diagram of an inverting amplifier, according to one embodiment of the present invention;

FIG. 6 is a circuit diagram of a single-ended operational amplifier, according to one embodiment of the present invention;

FIG. 7 is a circuit diagram of a single-ended-input-to-fully-balanced-converter amplifier, according to one embodiment of the present invention.

DETAILED DESCRIPTION

Embodiments of the present invention are directed to a linearized resistor, that is, a resistor having a relatively small voltage coefficient. Linearized resistors in accordance with the present invention may have different configurations and may be used as part of larger integrated circuits, which may have more than one such linearized resistor.

Figure 1:
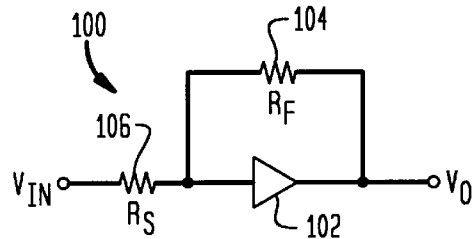
FIG. 1 is a circuit diagram of a conventional inverting amplifier comprising an operational amplifier, a feedback resistor, and a source resistor.
Figure 2:
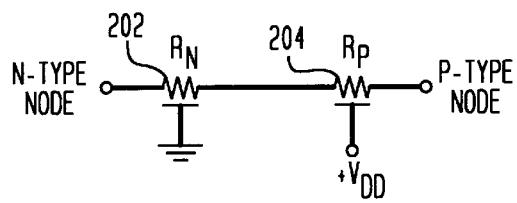
FIG. 2 is a circuit diagram of a linearized resistor, according to one embodiment of the present invention.

Referring now to FIG. 2, there is shown a circuit diagram of linearized resistor 200, according to one embodiment of the present invention. Linearized resistor 200 comprises N-type diffused resistor 202 connected in series to P-type diffused resistor 204. A diffused resistor is an integrated circuit device in which a dopant is implanted in a substrate to create a resistor. For example, an N-type diffused resistor may have a relatively heavy concentration of N-type dopant implanted in a P region of material (e.g., silicon) having relatively light P-type doping. Similarly, a P-type diffused resistor may have a relatively heavy concentration of P-type dopant implanted in an N region of silicon having relatively light N-type doping. In operation, the P region of the N-type resistor 202 is typically biased at the lowest available voltage level (e.g., ground), while the N region of the P-type resistor 204 is typically biased at the highest available voltage level (e.g., $V_{DD}$), as shown in FIG. 2. For purposes of this specification, linearized resistor 200 is said to have an N-type node and a P-type node, as shown in FIG. 2. Those skilled in the art will understand that linearized resistor 200 will tend to have a lower voltage coefficient than conventional IC resistors consisting of a single diffused resistor of either N-type or P-type. As such, linearized resistor 200 will have a more constant resistance value over its operating voltage range than such conventional IC resistors.

Figure 3:
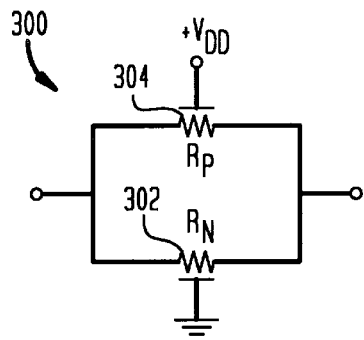
FIG. 3 is a circuit diagram of a linearized resistor, according to an alternative embodiment of the present invention.

Referring now to FIG. 3, there is shown a circuit diagram of linearized resistor 300, according to an alternative embodiment of the present invention. Linearized resistor 300 comprises N-type diffused resistor 302 connected in parallel to P-type diffused resistor 304.

Figure 4:
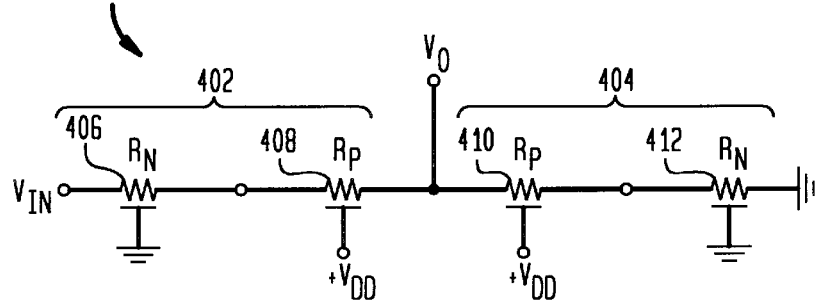
FIG. 4 is a circuit diagram of a voltage divider, according to one embodiment of the present invention.

Referring now to FIG. 4, there is shown a circuit diagram of voltage divider 400, according to one embodiment of the present invention. Voltage divider 400 comprises linearized resistor 402 connected in series to linearized resistor 404. Linearized resistor 402 comprises N-type resistor 406 and P-type resistor 408 connected in series, and linearized resistor 404 comprises P-type resistor 410 and N-type resistor 412 connected in series. The P-type node of linearized resistor 402 is connected to the P-type node of linearized resistor 404. When an input voltage signal $V_{IN}$ is applied to the N-type node of linearized resistor 402 and when a bias voltage signal (e.g., ground) is applied to the N-type node of linearized resistor 404, the output voltage signal $V_O$ of voltage divider 400 appears at the interconnection between the P-type nodes of linearized resistors 402 and 404. Those skilled in the art will understand that, in an alternative implementation of voltage divider 400, some or all of the N-type and P-type resistors may be reversed. In other words, P-type resistor 410 and N-type resistor 412 could be reversed, or N-type resistor 406 and P-type resistor 408 could be reverse, or both pairs of resistors could be reversed.

It will also be understood that by purposeful selection of the resistance values for the different diffused resistors in voltage divider 400, variations in the voltage division can be minimized.

Referring now to FIG. 5, there is shown a circuit diagram of inverting amplifier 500, according to one embodiment of the present invention. Inverting amplifier 500 comprises linearized resistors 502 and 504 and amplifier (amp) 506. Linearized resistor 502 comprises N-type resistor 508 and P-type resistor 510 connected in series, and linearized resistor 504 comprises P-type resistor 512 and N-type resistor 514 connected in series. The P-type nodes of linearized resistors 502 and 504 and the input to amp 506 are interconnected. The N-type node of linearized resistor 504 and the output of amp 506 are interconnected. As such, linearized resistor 502 functions as the source resistor and linearized resistor 504 functions as the feedback resistor in inverting amplifier 500.

When an input voltage signal $V_{IN}$ is applied to the N-type node of linearized resistor 502, the output voltage signal $V_O$ of inverting amplifier 500 appears at the output of amp 506. Those skilled in the art will understand that, in an alternative implementation of inverting amplifier 500, some or all of the N-type and P-type resistors may be reversed.

It will also be understood that by purposeful selection of the resistance values for the different diffused resistors in inverting amplifier 500, distortion introduced by the voltage variation of the resistors can be minimized. Depending on the selection of resistance values, inverting amplifier 500 can be designed such that the output voltage signal $V_O$ is the inverted version of the input voltage signals $V_{IN}$, with both voltages having approximately the same magnitude over the entire operating voltage range of inverting amplifier 500. This results in a differential voltage $V_{IN}$–$V_O$ with minimum distortion.

Referring now to FIG. 6, there is shown a circuit diagram of single-ended operational amplifier (op-amp) 600, according to one embodiment of the present invention. Op-amp 600 comprises linearized resistors 602 and 604 and differential amplifier (diff-amp) 606. Linearized resistor 602 comprises N-type resistor 608 and P-type resistor 610 connected in series, and linearized resistor 604 comprises P-type resistor 612 and N-type resistor 614 connected in series. The P-type nodes of linearized resistors 602 and 604 and one of the inputs to diff-amp 606 (e.g., the negative input) are interconnected. The N-type node of linearized resistor 604 and the output of diff-amp 606 are interconnected. As such, linearized resistor 602 functions as the source resistor and linearized resistor 604 functions as the feedback resistor in op-amp 600.

When an input voltage signal $V_{IN}$ is applied to the N-type node of linearized resistor 602 and when a bias voltage signal $V_{CM}$ is applied to the other input to diff-amp 606 (e.g., the positive input), the output voltage signal $V_O$ of op-amp 600 appears at the output of diff-amp 606. Those skilled in the art will understand that, in an alternative implementation of op-amp 600, some or all of the N-type and P-type resistors may be reversed.

It will also be understood that by purposeful selection of the resistance values for the different diffused resistors in op-amp 600, op-amp 600 can be designed to minimize distortion introduced by the voltage variation of the resistors over the operating voltage range of the op-amp. Depending on the selection of resistance values, op-amp 600 can be designed such that the output voltage signal $V_O$ is the inverted version of the input voltage signals $V_{IN}$, with both voltages having approximately the same magnitude over the entire operating voltage range of op-amp 600.

Referring now to FIG. 7, there is shown a circuit diagram of single-ended-input-to-fully-balanced-converter amplifier 700, according to one embodiment of the present invention. Amplifier 700 comprises linearized resistors 702–708 and diff-amp 710. Linearized resistor 702 comprises N-type resistor 712 and P-type resistor 714 connected in series, linearized resistor 704 comprises P-type resistor 716 and N-type resistor 718 connected in series, linearized resistor 706 comprises N-type resistor 720 and P-type resistor 722 connected in series, and linearized resistor 708 comprises P-type resistor 724 and N-type resistor 726 connected in series. The P-type nodes of linearized resistors 702 and 704 and one of the inputs to diff-amp 710 (e.g., the negative input) are interconnected. Similarly, the P-type nodes of linearized resistors 706 and 708 and the other input to diff-amp 710 (e.g., the positive input) are interconnected. The N-type node of linearized resistor 704 and one of the outputs of diff-amp 710 (e.g., the positive output) are interconnected. Similarly, the N-type node of linearized resistor 708 and the other output of diff-amp 710 (e.g., the negative output) are interconnected. As such, linearized resistors 702 and 706 function as source resistors and linearized resistors 704 and 708 function as feedback resistors in amplifier 700.

When an input voltage signal $V_{IN}$ is applied to the N-type node of linearized resistor 702 and when a bias voltage signal $V_{CM}$ is applied to the N-type node of linearized resistor 706, the differential output voltage signal $V_O$ of amplifier 700 appears across the two outputs of diff-amp 710. Those skilled in the art will understand that, in an alternative implementation of amplifier 700, some or all of the N-type and P-type resistors may be reversed.

It will also be understood that by purposeful selection of the resistance values for the different diffused resistors in amplifier 700, amplifier 700 can be designed to minimize distortion introduced by the voltage variation of the resistors over its operating voltage range.

Figure 8:
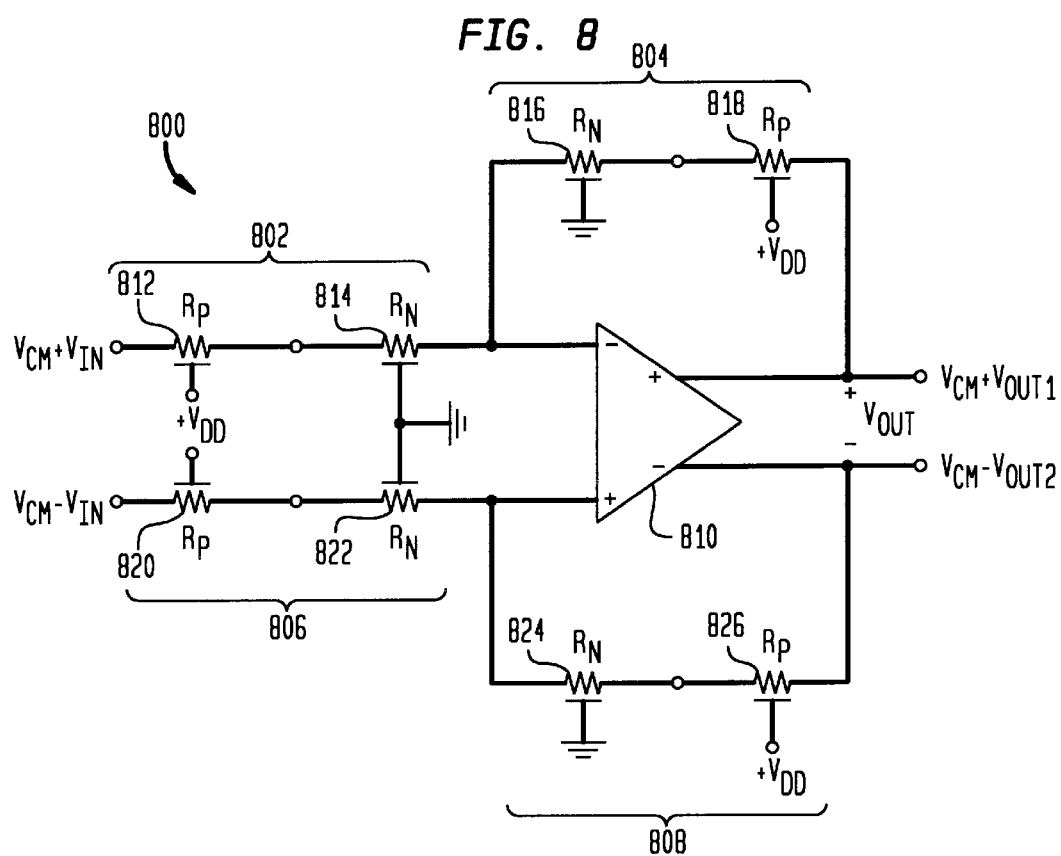
FIG. 8 is a circuit diagram of a fully differential operational amplifier, according to one embodiment of the present invention

Referring now to FIG. 8, there is shown a circuit diagram of fully differential operational amplifier 800, according to another embodiment of the present invention. Diff-op-amp 800 comprises linearized resistors 802–808 and diff-amp 810. Linearized resistor 802 comprises P-type resistor 812 and N-type resistor 814 connected in series, linearized resistor 804 comprises N-type resistor 816 and P-type resistor 818 connected in series, linearized resistor 806 comprises P-type resistor 820 and N-type resistor 822 connected in series, and linearized resistor 808 comprises N-type resistor 824 and P-type resistor 826 connected in series. The N-type nodes of linearized resistors 802 and 804 and one of the inputs to diff-amp 810 (e.g., the negative input) are interconnected. Similarly, the N-type nodes of linearized resistors 806 and 808 and the other input to diff-amp 810 (e.g., the positive input) are interconnected.

The P-type node of linearized resistor 804 and one of the outputs of diff-amp 810 (e.g., the positive output) are interconnected. Similarly, the P-type node of linearized resistor 808 and the other output of diff-amp 810 (e.g., the negative output) are interconnected. As such, linearized resistors 802 and 806 function as source resistors and linearized resistors 804 and 808 function as feedback resistors in diff-op-amp 800.

When a biased input voltage signal $V_{CM}+V_{IN}$ is applied to the P-type node of linearized resistor 802 and when the corresponding biased differential input voltage signal $V_{CM}-V_{IN}$ is applied to the P-type node of linearized resistor 806, the differential output voltage signal $V_{OUT}$ of diff-op-amp 800 is the difference $(V_{OUT1}+V_{OUT2})$ between the two single-ended output voltage signals ($V_{CM}+V_{OUT1}$ and $V_{CM}-V_{OUT2}$) of diff-amp 810. The differential output and both two single-ended outputs all have low distortion. Those skilled in the art will understand that, in an alternative implementation of diff-op-amp 800, some or all of the N-type and P-type resistors may be reversed.

It will also be understood that by purposeful selection of the resistance values for the different diffused resistors in diff-op-amp 800, diff-op-amp 800 can be designed to minimize distortion introduced by the voltage variation of the resistors over its operating voltage range.

FIGS. 4–8 show samples of circuits that can be implemented using linearized resistors according to the present invention. Those skilled in the art will understand that linearized resistors according to the present invention can be used in an almost limitless variety of other circuits. Furthermore, the circuits of FIGS. 4–8 are based on the serial version of the linearized resistor of the present invention as shown in FIG. 2, in which the P-type nodes form the interconnection between two linearized resistors. It will also be understood that, in alternative implementations of these and other circuits, the N-type nodes may form the interconnection between one or more of the different pairs of linearized resistors. Alternatively, pairs of linearized resistors may be interconnected by connecting the N-type node of one with the P-type node of the other. Furthermore, alternative circuit implementations may be based on the parallel version of the linearized resistor of the present invention as shown in FIG. 3. Still other circuits may utilize both the serial and parallel versions.

The determination of whether to connect P-type node to P-type node, N-type node to N-type node, or P-type node to N-type for each pair of interconnected linearized resistors in a circuit may be based on circuit simulations that indicate which embodiment provides the best performance for the particular application. Similarly, circuit simulations can be used to determine whether to use the serial version or the parallel version of each linearized resistor in a circuit, where circuit performance may be traded off based on other circuit characteristics such as area, capacitance, and bandwidth.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. In an integrated circuit, a passive linearized resistor, comprising a passive N-type diffused resistor connected in combination with a passive P-type diffused resistor, wherein the sheet resistivity, voltage coefficient, and size of each passive diffused resistor are selected so that the passive linearized resistor is substantially linearized with respect to applied voltage.

2. The invention of claim 1, wherein the N-type diffused resistor is connected in series with the P-type diffused resistor.

3. The invention of claim 1, wherein the N-type diffused resistor is connected in parallel with the P-type diffused resistor.

4. The invention of claim 1, wherein the linearized resistor is configured in the integrated circuit with one or more other such linearized resistors.

5. The invention of claim 4, wherein, for each linearized resistor in the integrated circuit, the N-type diffused resistor is connected in series with the P-type diffused resistor or the N-type diffused resistor is connected in parallel with the P-type diffused resistor.

6. The invention of claim 4, wherein:
   the circuit comprises first and second linearized resistors;
   each linearized resistor comprises a first node and a second node; and
   the first nodes of the first and second linearized resistors are interconnected.

7. The invention of claim 6, wherein:
   the first and second linearized resistors are serial-version linearized resistors, each having an N-type node and a P-type node;
   the first node of the first linearized resistor is the N-type node or the P-type node; and
   the first node of the second linearized resistor is the N-type node or the P-type node.

8. The invention of claim 6, wherein:
   the circuit is a voltage divider;
   the voltage divider is adapted to receive an input voltage and generate an output voltage;
   the second node of the first linearized resistor is adapted to receive the input voltage;
   the second node of the second linearized resistor is adapted to receive a bias voltage; and
   when the second node of the first linearized resistor receives the input voltage and the second node of the second linearized resistor receives the bias voltage, then the output voltage is generated at the interconnection between the first nodes of the first and second linearized resistors.

9. The invention of claim 8, wherein the bias voltage is ground.

10. The invention of claim 4, wherein:
    the circuit is an inverting amplifier comprising first and second linearized resistors and an amplifier (amp);
    each linearized resistor comprises a first node and a second node;
    the amp has an input and an output;
    the first nodes of the first and second linearized resistors and the input of the amp are interconnected; and
    the second node of the second linearized resistor and the output of the amp are interconnected.

11. The invention of claim 10, wherein:
    the inverting amplifier is adapted to receive an input voltage and generate an output voltage;
    the second node of the first linearized resistor is adapted to receive the input voltage; and
    when the second node of the first linearized resistor receives the input voltage, then the output voltage is generated at the output of the amp.

12. The invention of claim 4, wherein:

the circuit is a single-ended operational amplifier (op-amp) comprising first and second linearized resistors and a differential amplifier (diff-amp);

each linearized resistor comprises a first node and a second node;

the diff-amp has first and second inputs and an output;

the first nodes of the first and second linearized resistors and the first input of the diff-amp are interconnected; and the second node of the second linearized resistor and the output of the diff-amp are interconnected.

13. The invention of claim 12, wherein:

the op-amp is adapted to receive an input voltage and generate an output voltage;

the second node of the first linearized resistor is adapted to receive the input voltage;

the second input of the diff-amp is adapted to receive a bias voltage; and when the second node of the first linearized resistor receives the input voltage and the second input of the diff-amp receives the bias voltage, then the output voltage is generated at the output of the diff-amp.

14. The invention of claim 4, wherein:

the circuit is a differential operational amplifier (diff-op-amp) comprising first, second, third, and fourth linearized resistors and a diff-amp;

each linearized resistor comprises a first node and a second node;

the diff-amp has first and second inputs and first and second outputs;

the first nodes of the first and second linearized resistors and the first input of the diff-amp are interconnected;

the first nodes of the third and fourth linearized resistors and the second input of the diff-amp are interconnected;

the second node of the second linearized resistor and the first output of the diff-amp are interconnected; and the second node of the fourth linearized resistor and the second output of the diff-amp are interconnected.

15. The invention of claim 14, wherein:

the op-amp is adapted to receive an input voltage and generate a differential output voltage such that the circuit operates as a single-ended input differential operational amplifier;

the second node of the first linearized resistor is adapted to receive the input voltage;

the second node of the third linearized resistor is adapted to receive a bias voltage; and when the second node of the first linearized resistor receives the input voltage and the second node of the third linearized resistor receives the bias voltage, then the differential output voltage is generated across the first and second outputs of the diff-amp.

16. The invention of claim 14, wherein:

the op-amp is adapted to receive an input voltage and generate a differential output voltage such that the circuit operates as a fully differential operational amplifier;

the second node of the first linearized resistor is adapted to receive a biased input voltage corresponding to the sum of a bias voltage and the input voltage;

the second node of the third linearized resistor is adapted to receive a biased differential input voltage corresponding to the difference between the bias voltage and the input voltage; and when the second node of the first linearized resistor receives the biased input voltage and the second node of the third linearized resistor receives the biased differential input voltage, then the differential output voltage is generated across the first and second outputs of the diff-amp.

17. In an integrated circuit, a linearized resistor, comprising an N-type diffused resistor connected in combination with a P-type diffused resistor, wherein:

the sheet resistivity, voltage coefficient, and size of each diffused resistor are selected so that the linearized resistor is substantially linearized with respect to applied voltage;

the circuit is a voltage divider comprising first and second linearized resistors;

each linearized resistor comprises a first node and a second node;

the first nodes of the first and second linearized resistors are interconnected;

the voltage divider is adapted to receive an input voltage and generate an output voltage;

the second node of the first linearized resistor is adapted to receive the input voltage;

the second node of the second linearized resistor is adapted to receive a bias voltage; and when the second node of the first linearized resistor receives the input voltage and the second node of the second linearized resistor receives the bias voltage, then the output voltage is generated at the interconnection between the first nodes of the first and second linearized resistors.

18. The invention of claim 17, wherein the bias voltage is ground.

19. In an integrated circuit, a linearized resistor, comprising an N-type diffused resistor connected in combination with a P-type diffused resistor, wherein:

the sheet resistivity, voltage coefficient, and size of each diffused resistor are selected so that the linearized resistor is substantially linearized with respect to applied voltage;

the circuit is an inverting amplifier comprising first and second linearized resistors and an amplifier (amp);

each linearized resistor comprises a first node and a second node;

the amp has an input and an output;

the first nodes of the first and second linearized resistors and the input of the amp are interconnected; and the second node of the second linearized resistor and the output of the amp are interconnected.

20. The invention of claim 19, wherein:

the inverting amplifier is adapted to receive an input voltage and generate an output voltage;

the second node of the first linearized resistor is adapted to receive the input voltage; and when the second node of the first linearized resistor receives the input voltage, then the output voltage is generated at the output of the amp.

21. In an integrated circuit, a linearized resistor, comprising an N-type diffused resistor connected in combination with a P-type diffused resistor, wherein:

the sheet resistivity, voltage coefficient, and size of each diffused resistor are selected so that the linearized resistor is substantially linearized with respect to applied voltage;

the circuit is a single-ended operational amplifier (op-amp) comprising first and second linearized resistors and a differential amplifier (diff-amp);

each linearized resistor comprises a first node and a second node;

the diff-amp has first and second inputs and an output;

the first nodes of the first and second linearized resistors and the first input of the diff-amp are interconnected; and the second node of the second linearized resistor and the output of the diff-amp are interconnected.

22. The invention of claim 21, wherein:

the op-amp is adapted to receive an input voltage and generate an output voltage;

the second node of the first linearized resistor is adapted to receive the input voltage;

the second input of the diff-amp is adapted to receive a bias voltage; and when the second node of the first linearized resistor receives the input voltage and the second input of the diff-amp receives the bias voltage, then the output voltage is generated at the output of the diff-amp.

23. In an integrated circuit, a linearized resistor, comprising an N-type diffused resistor connected in combination with a P-type diffused resistor, wherein:

the sheet resistivity, voltage coefficient, and size of each diffused resistor are selected so that the linearized resistor is substantially linearized with respect to applied voltage;

the circuit is a differential operational amplifier (diff-op-amp) comprising first, second, third, and fourth linearized resistors and a diff-amp;

each linearized resistor comprises a first node and a second node;

the diff-amp has first and second inputs and first and second outputs;

the first nodes of the first and second linearized resistors and the first input of the diff-amp are interconnected;

the first nodes of the third and fourth linearized resistors and the second input of the diff-amp are interconnected;

the second node of the second linearized resistor and the first output of the diff-amp are interconnected; and the second node of the fourth linearized resistor and the second output of the diff-amp are interconnected.

24. The invention of claim 23, wherein:

the op-amp is adapted to receive an input voltage and generate a differential output voltage such that the circuit operates as a single-ended input differential operational amplifier;

the second node of the first linearized resistor is adapted to receive the input voltage;

the second node of the third linearized resistor is adapted to receive a bias voltage; and when the second node of the first linearized resistor receives the input voltage and the second node of the third linearized resistor receives the bias voltage, then the differential output voltage is generated across the first and second outputs of the diff-amp.

25. The invention of claim 23, wherein:

the op-amp is adapted to receive an input voltage and generate a differential output voltage such that the circuit operates as a fully differential operational amplifier;

the second node of the first linearized resistor is adapted to receive a biased input voltage corresponding to the sum of a bias voltage and the input voltage;

the second node of the third linearized resistor is adapted to receive a biased differential input voltage corresponding to the difference between the bias voltage and the input voltage; and when the second node of the first linearized resistor receives the biased input voltage and the second node of the third linearized resistor receives the biased differential input voltage, then the differential output voltage is generated across the first and second outputs of the diff-amp.

* * * * *